(12) United States Patent
Jones (10) Patent No.: US 6,407,682 B1
(45) Date of Patent: Jun. 18, 2002

(54) HIGH SPEED SERIAL-DESERIALIZER RECEIVER

(75) Inventor: Matthew S. Jones, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 26 days.

(21) Appl. No.: 09/609,329

(22) Filed: Jun. 30, 2000

(51) Int. Cl.[7] .................................................. H03M 9/00
(52) U.S. Cl. ........................ 341/100; 341/95; 341/101; 341/141; 341/142; 341/143; 341/146
(58) Field of Search ................................. 341/100, 101, 341/141, 142, 143, 146, 95

(56) References Cited

U.S. PATENT DOCUMENTS

| | | | | |
|---|---|---|---|---|
| 4,710,922 A | * | 12/1987 | Scott | 370/112 |
| 5,777,567 A | * | 7/1998 | Murata | 341/100 |
| 5,933,037 A | * | 8/1999 | Momtaz | 327/157 |
| 6,018,305 A | * | 1/2000 | Kikuchi | 341/100 |
| 6,177,891 B1 | * | 1/2001 | Nakamura | 341/100 |
| 6,259,387 B1 | * | 7/2001 | Fukazawa | 341/100 |

* cited by examiner

Primary Examiner—Michael Tokar
Assistant Examiner—Khai M. Nguyen
(74) Attorney, Agent, or Firm—Antonelli, Terry, Stout & Kraus, LLP (57) ABSTRACT

A serial-deserializer converts a high speed serial data input to a lower speed parallel output. By including this circuit on a chip, connections to the chip are made more easily. A gated voltage controlled oscillator provides clock signals to sample the data input at a high rate. The output signals are thus provided at a slower rate.

26 Claims, 5 Drawing Sheets

HIGH SPEED SERIAL-DESERIALIZER RECEIVER

FIELD

The present invention is directed to a deserializing receiver and, more particularly, to a high speed circuit for deserializing a serial input.

BACKGROUND

The use of integrated circuit chips has revolutionized the electronic industry by making devices easy and inexpensive to build and also very reliable. Not only are the individual circuit parts extremely small, but the connections between them are very short, which reduces delays in the signal. Also, by including the connections as part of the chip, it is not necessary to hardwire the circuits together, thus making the device less expensive and more reliable.

However, the size of the chip also makes outside connections more difficult. Accordingly, it is preferable to have as few connections between chips as possible. Making such connections are difficult and expensive and also creates problems of reliability. Further, the size of the chip makes the number of possible connections limited.

One method of dealing with this problem, as far as data input is concerned, is to use a serial input for the data. However, putting data in serial form requires a longer time to load the data into the chip and, accordingly, can slow down the operation of the device.

BRIEF DESCRIPTION OP THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and the invention is not limited thereto. The spirit and scope of the present invention are limited only by the terms of the appended claims.

The following represents brief descriptions of the drawings, wherein.

DETAILED DESCRIPTION

Before beginning a detailed description of the subject invention, mention of the following is in order. When appropriate, like reference numerals and characters may be used to designate identical, corresponding or similar components in differing figure drawings. Further, in the detailed description to follow, example sizes/models/values/ranges may be given, although the present invention is not limited to the same. As a final note, well known power/ground connections to ICs and other components may not be shown within the FIGS. for simplicity of illustration and discussion, and so as not to obscure the invention. Further, arrangements may be shown in block diagram form in order to avoid obscuring the invention, and also in view of the fact that specifics with respect to implementation of such block diagram arrangements is highly dependent upon the platform within which the present invention is to be implemented, i.e., specifics should be well within purview of one skilled in the art. Where specific details (e.g., circuits, flowcharts) are set forth in order to describe example embodiments of the invention, it should be apparent to one skilled in the art that the invention can be practiced without these specific details. Finally, it should be apparent that any combination of hard-wired circuitry and software instructions can be used to implement embodiments of the present invention, i.e., the present invention is not limited to any specific combination of hardware circuitry and software instructions.

Figure 1:
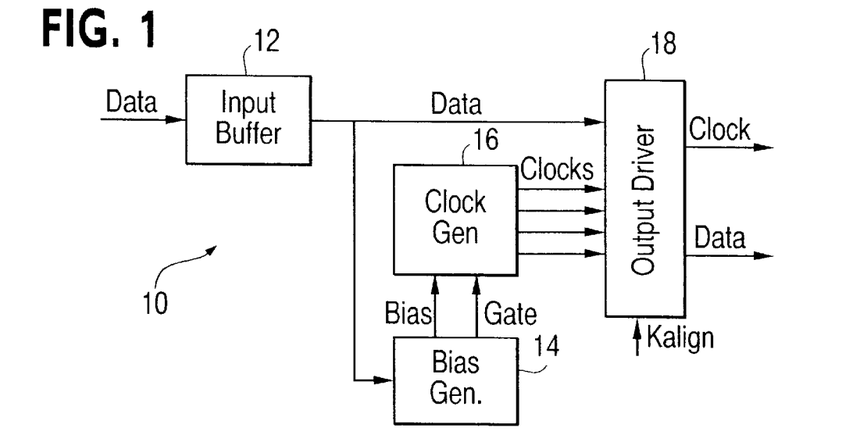
FIG. 1 is a block diagram of a first example embodiment of the present invention.

FIG. 1 shows a first example embodiment of the present invention. The circuit is designed to receive a high speed serial data input to a chip. By using a serial input, the connections to the chip are reduced. In order to compensate for having a single data input, the signal is sent at very high speed, such as 2.5 Gbps. The signal must then be reduced in speed and converted to parallel form in order to be used by other circuits on the chip. Thus, the present invention acts to receive a high speed serial input and convert it to a slower parallel digital output for use by other circuits.

FIG. 1 shows the serial-deserializer circuit 10 as including an input buffer 12, a bias generator 14, a clock generator 16 and an output driver 18. The input data is first received in an input buffer 12. The buffered data signal is sent to an output driver and at the same time also sent to a bias generator 14. The bias generator provides a gating signal to the clock generator and also a bias signal to the clock generator. The bias signal adjusts the speed of the clock generator while the gate signal indicates the beginning of the clock signal. The clock generator outputs four separate clock signals which are also sent to the output driver. The output driver generates a 20 bit wide parallel output operating at one-twentieth of the input clock frequency or at 125 MHz. The output driver also produces an output clock signal at this same frequency.

Figure 2:
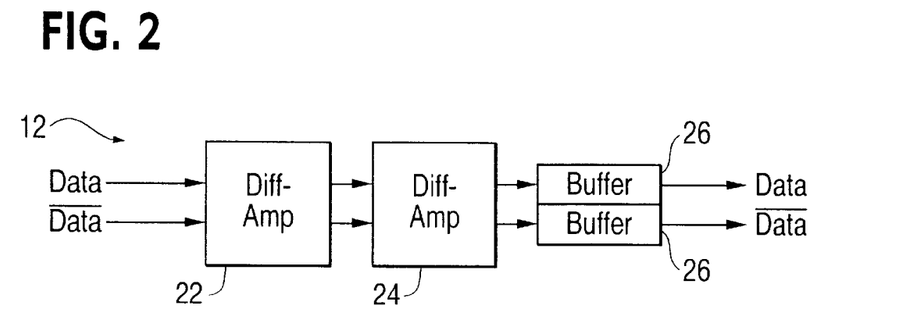
FIG. 2 is a block diagram of the input buffer of FIG. 1.

FIG. 2 shows the details of input buffer 12. A first differential amplifier 22 receives the data input signal and also receives the inverse of the same signal. An inverter can provide the inverted data signal, although this is not seen. The differential amplifier receives these two signals and acts to raise the input voltage to digital logic levels. Differential amplifiers 22 and 24 may also receive bias levels to help establish the specific voltage levels for the digital logic signals. The digital signals will have high and low values of 0.97 volts and 0.47 volts respectively. Since a differential amplifier is designed to raise the signal by a certain percentage, it may be necessary to have more than one differential amplifier if that percentage is not sufficient. Buffers 26 are provided to receive the outputs of the differential amplifiers. These consist of an even numbered chain of inverters. The purpose of the inverters is to increase the slew rate (decrease the rise and fall time) of the data. They also are necessary to drive the load of the output driver. Thus, the buffered output data and inverted data signals are outputs from the input buffer. While the inverted data signal is not used further in the present embodiment, it is provided to ensure a proper parasitic balance of the circuit on the chip.

Figure 3:
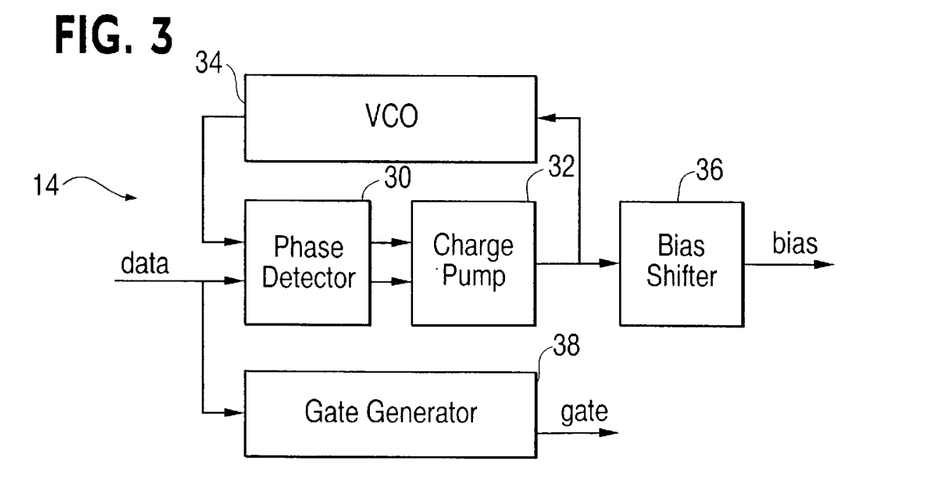
FIG. 3 is a block diagram of the bias generator of FIG. 1.

FIG. 3 shows the details of bias generator 14. The purpose of the bias generator is to provide a bias voltage that determines the period of the clock oscillators. In addition, the bias generator provides a gate signal in order to synchronize it with the data. The data output of the input buffer is used as the input to bias generator 14. Thus, the bias voltage is a function of the data input. Specifically, it forms one input to phase detector 30. The phase detector compares this incoming data signal to the output of the voltage controlled oscillator 34. Depending on whether the phase is leading or lagging, a signal is produced on one of the two outputs. These two outputs are provided to charge pump 32 which stores the charge so as to produce a feedback bias output which forms the input to the voltage controlled oscillator 34. The charge in charge pump 32 may be increased if the phase is lagging so as to produce a larger feedback bias and thus increase the oscillation frequency of the VCO 34. Alternatively, if the phase is leading, a signal is sent on the other output of the phase detector so that the charge in charge pump 32 decreases and thus the feedback bias also decreases so as to lower the oscillation frequency of VCO 34. The same bias is also provided to bias shifter 36 which sends the bias signal to the clock generator to similarly control the oscillators of the clock generator. This system is provided so that the unit interval of the data can be adjusted in case it should drift over time.

The voltage controlled oscillator runs at a frequency of roughly 2.5 GHz. This system guarantees that for every data rising edge, there will exist a rising edge in the other input to the phase detector. This can only be achieved by using a 2.5 GHz clock since any bit boundary can have a rising data edge. The phase detector must be adjusted so that it only updates its output on a data edge, since there will not always be a data edge corresponding to every clock edge.

As indicated above, the bias shifter 36 receives the same bias that is provided as a feedback to the VCO. The bias shifter converts this bias voltage to one that is appropriate for the voltage controlled oscillator and the clock generator.

Gate generator 38 also receives the same data input that is received in the phase detector. This generator provides a gate signal to the clock generator so that it is aligned with the data signal.

Figure 4:
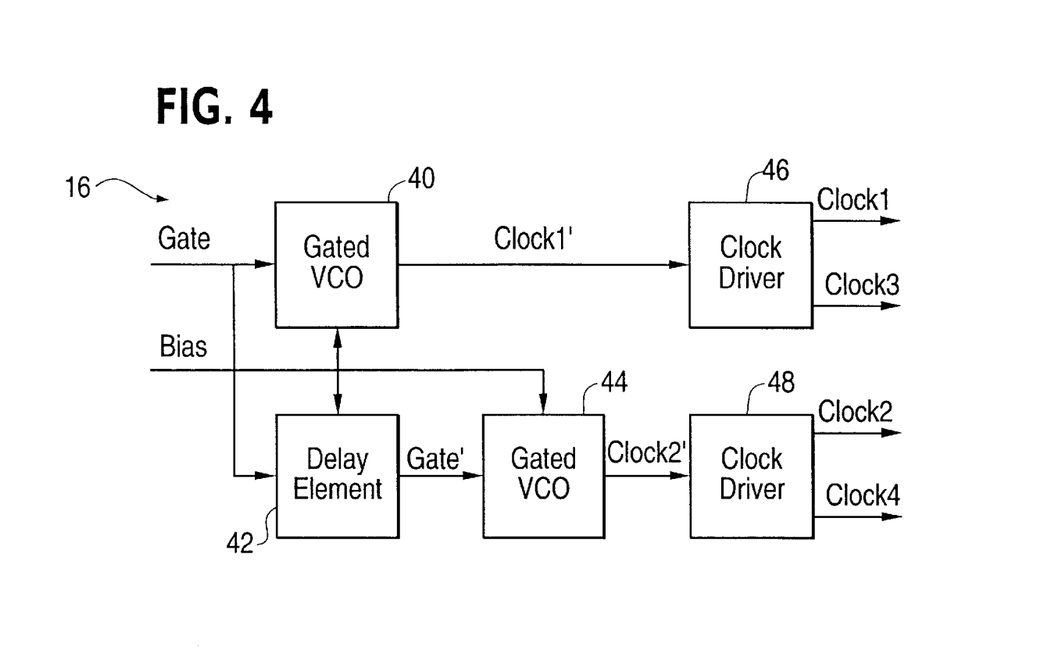
FIG. 4 is a block diagram of the clock generator of FIG. 1.

FIG. 4 shows the details of clock generator 16. A first gated voltage controlled oscillator 40 receives the gate signal from the bias generator. The gated-VCO may be similar to that discussed in a paper "A 156 Mb/s CMOS Clock Recovery Circuit for a Burst-Mode Transmission" by Nakamura, et al, 1997. The gate signal provides a start signal for the voltage control oscillator. When the gate is inactive, so is the oscillator. The voltage controlled oscillator contains a NAND gate and two inverters. The NAND gate is used to reset the clock. A typical VCO contains an odd number of inverters and accordingly will run freely. The NAND gate is used to reset the clock so that the edges can be fixed relative to the data edge. Once this has occurred, the bias voltage will make minor adjustments so that the clock can stay synchronized with the data signal. The bias signal from the bias generator is also applied to the voltage controlled oscillator which controls the frequency of oscillation. The output of VCO 40 is a clock signal indicated as clock1'.

The gate and bias signals are also applied to delay element 42. By delaying the gate signal, gated voltage control oscillator 44 will start to oscillate at a later time than VCO 40. However, the same bias is applied so that they will operate at the same frequency.

The same bias signal applied to gated VCO's 40 and 44 is also applied to the delay element 42. This signal adjusts the delay element in the same way that the frequency of the oscillator is adjusted. This is necessary since there are minor fluctuations of the data rate around the nominal rate. Thus, the bias adjusts both the oscillating frequency and the delay between the two oscillators.

Thus, the resultant output is the clock2' signal which has the same frequency as the clock1' signal but is delayed roughly 90°. For example, the clock signals can have the period of 1.6 ns and a 50% duty cycle. The second signal is phase shifted from the first by 400 ps. The clock1' and clock2' signals are used as inputs to clock drivers 46 and 48 respectively. The clock drivers then produce four output clock signals. The first clock driver produces the clock1 signal which is the inverse of clock1' and clock3 signal which is the inverse of the clock1 signal. Similarly, the second clock driver produces the clock2 signal which is the inverse of clock 2' and its inverse clock4. The clock2 signal is delayed from the clock1 signal by 90° and likewise clock4 is delayed by 90° from clock3. Since the two sets of clocks which are inverses of each other are by definition 180° out of phase, the four clock signal form a sequence at 90° intervals. Accordingly, for each gate signal produced, four evenly spaced clock signals result.

Figure 5:
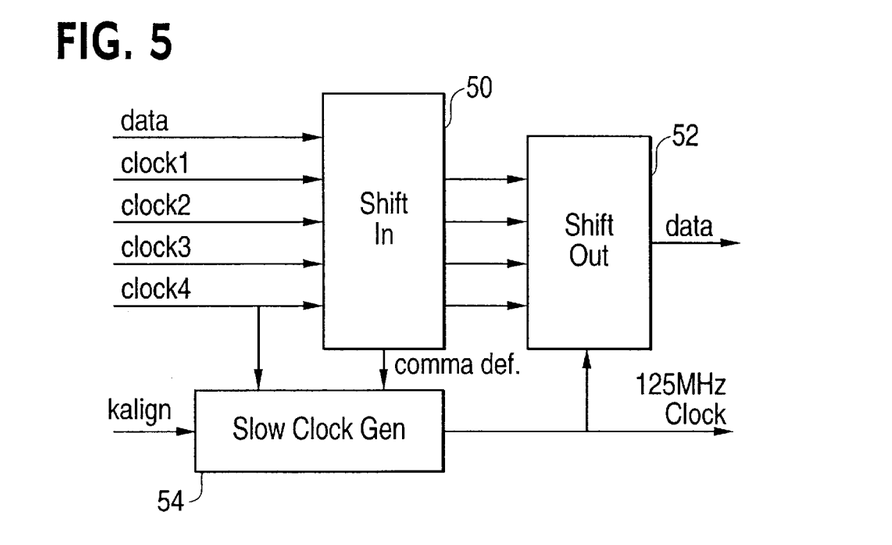
FIG. 5 is a block diagram of the output driver of FIG. 1.

As seen in FIG. 5, the output driver 18 receives the four clock signals and the buffer data signal. These are received in shift-in block 50 which contains 20 edge-triggered latches. The latches are provided in four groups of five. For each period, each of the four clock signal samples the data signal and holds the data signal in one latch. Thus for each period, four latches are filled. After five clock periods, the data signal is sampled five times by each of the four clock signals so that all 20 latches are filled. The shift-in block 50 has parallel outputs connected to a shift-out block 52. The shift-in block has a clock speed of 625 MHz but utilizes four phase-shifted clocks so that the effect is rising a clock edge approximately every 400 ps, which is the same as a 2.5 GHz clock. Four data latches are filled every clock period and are shifted to the shift-out block. Since the shift-out block operates at only ⅕ of the speed of the shift-in block, five sets of four data periods are accumulated before the shift-out clock outputs the 20 bit wide data output. Shift registers may be used to move the data from the shift-in block to the shift out block.

Slow clock generator 54 receives the clock4 signal of 625 MHz at an input and divides it by five in order to create a clock signal having a frequency of one fifth that of the four clock signals. Thus, instead of a clock signal of 2.5 GHz, the slow clock generator produces a clock signal of 125 MHz. This slower clock is used to shift out the data from the 20 latches through shift out block 52. The resultant data is output from the system as 20 parallel data signals. The slow clock is also used as a clock output for use by other circuits on the chip. This same output is used to reset shift-out block 52.

It is also possible to add a shift-out block between the shift-in block and shift-out block. This would operate in a similar fashion to the shift-out block and would also be reset by the output of the slow clock generator.

In certain coding systems such as the 8B/10B system, special control characters are utilized to help synchronize the signals. One of these is the "comma" signal. When the system needs to align the data signals, a KALIGN signal is asserted. This is provided to the slow clock generator 54 which will not then produce a clock signal until a comma character is detected in the shift end block. Since this character is the only character to contain five consecutive ones in a ten-bit character, a simple AND gate connected to the appropriate latches will indicate when a comma is detected. When this is detected, the slow clock generator is then gated to produce the clock signal and to shift out the data at a speed of 125 MHz. Thus, the data speed is reduced by a factor of 20 and is provided in a parallel output 20 bits wide. As a result, the chip can receive the data along with a single serial input at a very fast speed and provide the data signal to the remaining circuits on the chip at a slower speed. It would also be possible to instead apply the KALIGN signal to the shift-out block directly. In this case, the clock will continue to shift data out once the comma is deleted and will reset the clocks to align to the comma character.

Figure 6:
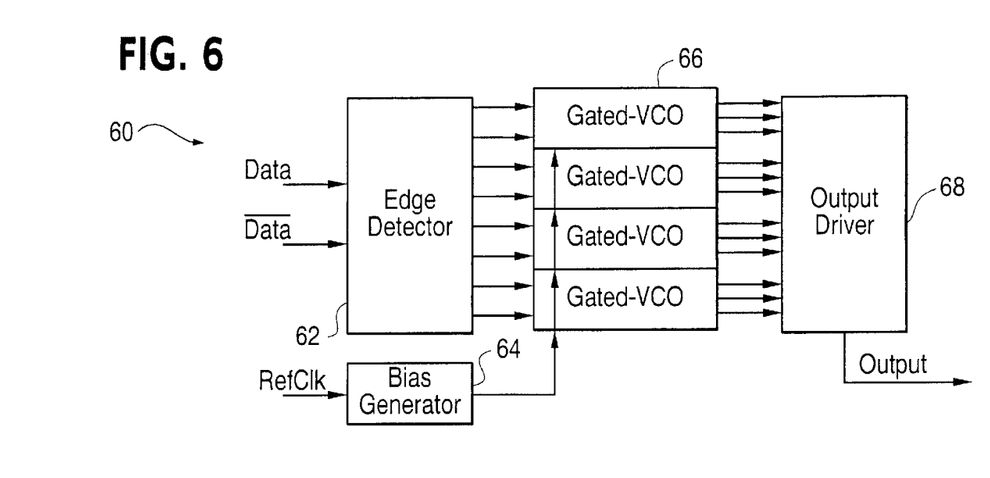
FIG. 6 is a block diagram of a second example embodiment of the present invention.

A second exemplary embodiment is shown in FIGS. 6–9. As shown in FIG. 6, the overall device 60 includes an edge detector 62, bias generator 64, gated voltage control oscillators 66 and output driver 68. The input data signal is received in edge detector 62 which shows down the data rate by a factor of four and produces outputs indicating the front and rear edges of four data signals. These are provided to four separate gated voltage controlled oscillators. Each of these oscillators provides the output driver with a data input, a clock signal and the inverse of the clock. A bias generator 64 produces a bias voltage to control the oscillating frequency of the gated VCO circuits.

Figure 7:
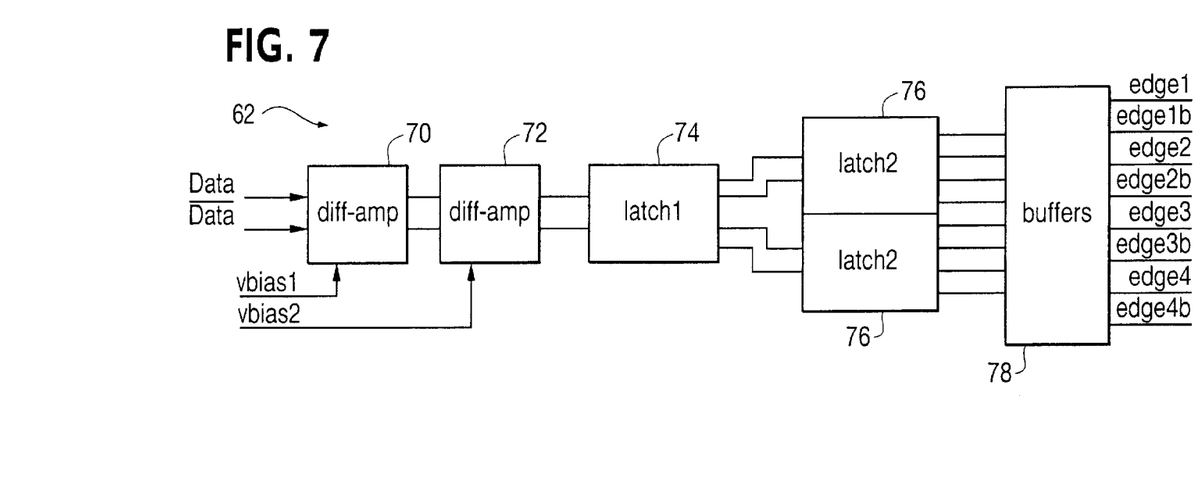
FIG. 7 is a block diagram of the edge detector of FIG. 6.

FIG. 7 shows the details of edge detector 62. Differential amplifier 70 receives the data input and its inverse as well as a bias signal. A second differential amplifier 72 is provided sequentially in the same manner as in the first embodiment. The second differential amplifier also receives a bias signal. As in the first embodiment, the digital logical levels are set. The data signal and its inverse is provided to a first latch 74. This latch produces two sets of outputs with their inverse. The first output starts with the rising of the data input signal and the second output starts with the falling edge of the input signal. The periods of the output signals are twice those of the input signals. Each output signal and its inverse is provided to a second latch 76. A similar operation occurs in each second latch so that a total of four pairs of outputs result from the latches which are used as inputs to buffers 78. The period of the signals which are sent to the buffers are four times those of the input to the first latch. The buffers then provide eight outputs which indicate the edges of each input pulse and their inverses. As can easily be seen, it is possible to double the input data rate by adding another stage of latches as desired.

Figure 8:
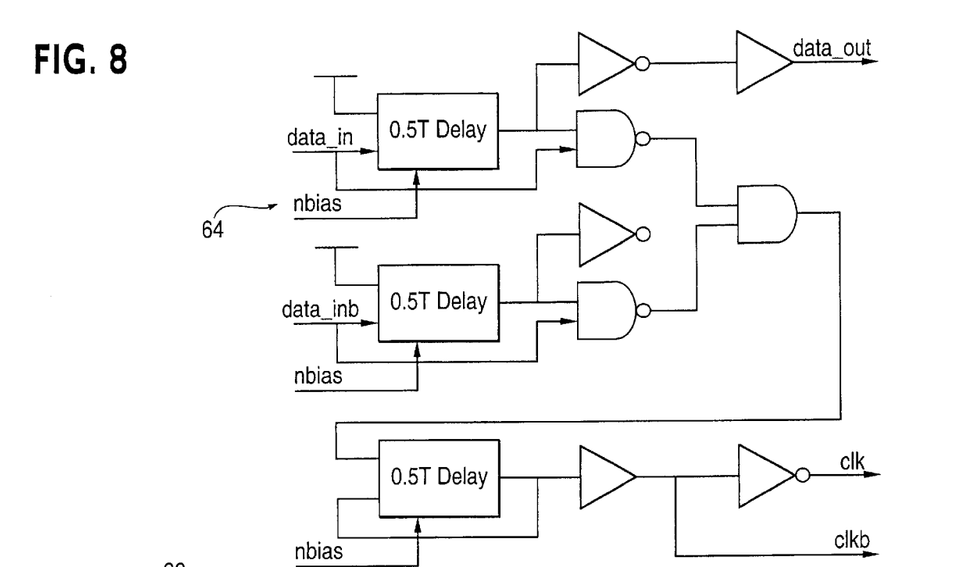
FIG. 8 is a block diagram of a gated VCO of FIG. 6.

FIG. 8 shows details of each gated VCO 64. As shown in FIG. 8, each oscillator is made of three inverting delay elements along with NAND and INV logic gates. The output of the AND gate gates the VCO to create the clock. Whenever the output of the AND gate is low, the clock is allowed to oscillate so that it can latch data. The circuit guarantees that the clock will arrive with a certain delay defined by a bias.

Figure 9:
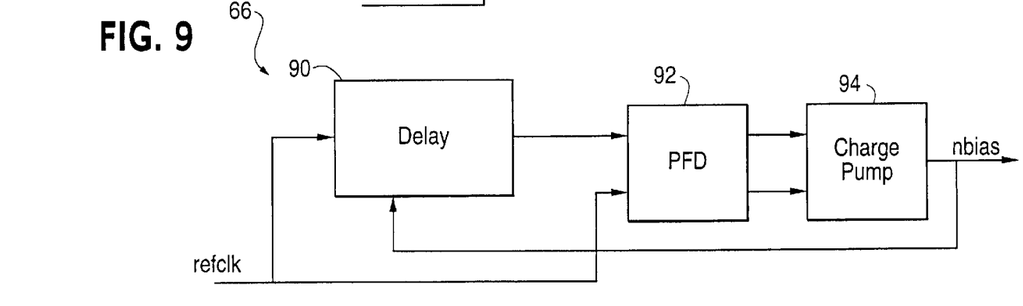
FIG. 9 is a block diagram of a bias generator of FIG. 6.

FIG. 9 shows the details of bias generator 66. The bias generator includes delay 90, phase-frequency detector 92 and charge pump 94. An external reference clock signal is provided to delay 90. It is also provided to the phase frequency detector 92. The delayed clock signal is also provided to the same detector. The two signals are compared to determine the phase difference therebetween. The result determines how much charge is held in the charge pump to produce an outgoing bias signal. The outgoing bias signal is also fed back to the delay to determine the amount of delay prior to the incoming clock signal. This bias signal is also used to control the voltage controlled oscillators.

Output driver 68 receives three outputs from each gated VCO. It receives a data signal, a clock signal and an inverse of the clock signal. Each data signal is really a series of four data signals as indicated in FIG. 7. The output driver receives a number of inputs which it then provides to a 20 bit wide parallel output. Thus, this embodiment performs the same function as the first embodiment, that is, converting a fast serial input data to a 20 bit wide parallel output at a slower speed.

Several advantages are achieved using the present invention. As noted earlier, it is possible to easily scale the device to higher data rates. It also provides a relatively low reliance on high speed clocks from external sources. Instead it creates its own clock using the gated VCO. The gating feature requires it to be reset whenever a new data edge is received which helps to compensate for jitter and other variation in the received data input.

Figure 10:
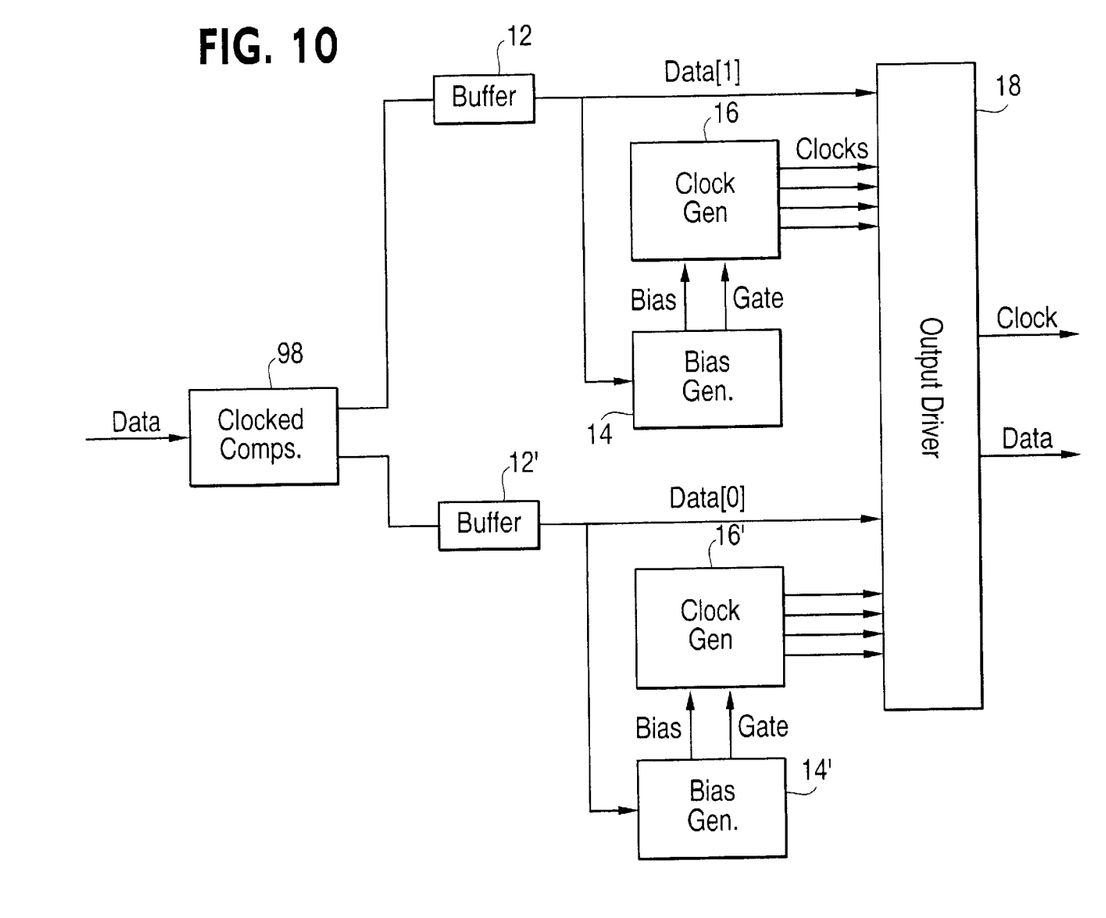
FIG. 10 is a block diagram of a scaled version of the example embodiment shown in FIG. 1.

In regard to the first embodiment, it is possible to scale the design, to receive faster inputs. This can be accomplished by replicating the clock and bias generators and using a different form of input buffer. As seen in FIG. 10, the input buffer would consist of clocked comparators 98 and the output driver would receive all eight clocks and generate a slow clock frequency which is one-twentieth of the data rate. The block diagram shown in FIG. 10 would be appropriate for a data rate of 5.0 Gbps. The data rate can be doubled again by increasing the number of clock and bias generators.

Numerous additional modifications and variations of the present invention are possible in light of the above teachings. It is, therefore, to be understood that within the scope of the appended claims, the invention may be practiced otherwise than as specifically described herein.

What is claimed is:

1. A receiver apparatus for a serial input comprising:
   an input device for receiving said serial input and transforming digital logic levels of the signal input;
   a bias generator for producing a bias control signal and a gate signal;
   least one gated voltage controlled oscillator connected to said bias generator and receiving said gate signal and said bias control signal where the frequency of oscillation depends on said bias signal, said oscillator producing a plurality of output clock signals;
   an output driver receiving said plurality of clock signals and said transformed serial input to produce a plurality of output signals in parallel.

2. The apparatus according to claim 1, wherein an output from said input device is connected to the output driver and the bias generator.

3. The apparatus according to claim 1, wherein an output from said input device is connected to the at least one gated voltage controlled oscillator.

4. The apparatus according to claim 1, wherein the input device includes at least one differential amplifier receiving the serial input and connected to at least one buffer which produces a buffered output.

5. A receiver apparatus for a serial input comprising:
   an input device for receiving said serial input and transforming digital logic levels of the serial input;
   a bias generator for producing a bias control signal;
   at least one gated voltage controlled oscillator connected to said bias signal where the frequency of oscillation depends on said bias signal, said oscillator producing a plurality of output clock signals;
   an output driver receiving said plurality of clock signals and said transformed serial input to produce a plurality of output signals in parallel wherein the input device is an edge detector containing at least one differential amplifier for receiving said serial input, at least one latch producing at least two outputs, with one output related to the rising of the serial input and the other output related to the falling of the serial input.

6. The apparatus according to claim 5, wherein the frequency of each output of said latch is half that of said input.

7. The apparatus according to claim 1, wherein said bias generator includes:
a phase detector receiving an output of said input device;
a charge pump connected to an output of said phase detector; and
a voltage controlled oscillator connected to an output of said charge pump and producing an output as a second input to said phase detector;
the output of said charge pump being related to said bias signal.

8. The apparatus according to claim 7, wherein said bias generator further comprises a bias shifter for receiving the output from said charge pump and producing said bias signal.

9. The apparatus according to claim 8, wherein said bias generator further comprises a gate generator connected to the output of said input device and producing a gate signal connected to said clock generator.

10. The apparatus according to claim 1, wherein said output driver includes a shift-in circuit receiving said plurality of clock signals and said transformed serial input, and a shift-out circuit for producing said output signals.

11. A receiver apparatus for a serial input comprising:
an input device for receiving said serial input and transforming digital logic levels of the serial input;
a bias generator for producing a bias control signal;
at least one gated voltage controlled oscillator connected to said bias signal where the frequency of oscillation depends on said bias signal, said oscillator producing a plurality of output clock signals;
an output driver receiving said plurality of clock signals and said transformed serial input to produce a plurality of output signals in parallel wherein said output driver includes a shift-in circuit receiving said plurality of clock signals and said transformed serial input, and a shift-out circuit for producing said output signals wherein said output driver further comprises a detection circuit for detecting a request to align the output signal and for detecting the presence of a specific signal in said serial input to which the output signal is aligned.

12. The apparatus according to claim 1, wherein a bit rate of said serial input is a multiple of a bit rate of said output signals with the number of said output signals being said multiple.

13. The apparatus according to claim 1, wherein said receiver apparatus is scalable.

14. An apparatus for deserializing a serial input comprising:
an input buffer for receiving said serial input and producing a buffered serial output;
a bias generator for receiving said buffered serial output and producing a bias control signal and a gate signal;
a clock generator for receiving said bias control signal and said gate signal and producing a plurality of clock signals;
an output driver receiving said plurality of clock signals and said buffered serial output and producing a plurality of parallel output signals.

15. The apparatus according to claim 14, wherein said input buffer comprises:
at least one differential amplifier receiving said serial input and at least one buffer producing said buffered serial output.

16. The apparatus according to claim 14, wherein said bias generator comprises:
a phase detector receiving said buffered output;
a charge pump connected to an output of said phase detector;
a voltage controlled oscillator connected to an output of said charge pump and producing an output connected to a second input of said phase detector;
said charge pump having an output which is related to said bias control signal.

17. The apparatus according to claim 16, wherein said bias generator further comprises a bias shifter for receiving said output of said charge pump and producing said bias control signal.

18. The apparatus according to claim 17, wherein said bias generator further comprises a gate generator connected to said buffered serial output and producing said gate signal.

19. An apparatus for deserializing a serial input comprising:
an input buffer for receiving said serial input and producing a buffered serial output;
a bias generator for receiving said buffered serial output and producing a bias control signal and a gate signal;
a clock generator for receiving said bias control signal and said gate signal and producing a plurality of clock signals;
an output driver receiving said plurality of clock signals and said buffered serial output and producing a plurality of parallel output signals; wherein said clock generator includes a first and a second gated voltage controlled oscillator;
a delay element;
said first gated voltage controlled oscillator receiving said gate signal and said bias control signal and producing a first clock output;
said delay element receiving said gate signal and said bias control signal to produce a delayed gate signal where the amount of delay is controlled by said bias control signal;
said second voltage controlled oscillator receiving said delayed gate signal and said bias control signal to produce a second clock output;
a first and a second clock driver connected to said first and second clock outputs, respectively, for producing for producing four clock signals at 90° intervals.

20. An apparatus for deserializing a serial input comprising:
an input buffer for receiving said serial input and producing a buffered serial output;
a bias generator for receiving said buffered serial output and producing a bias control signal and a gate signal;
a clock generator for receiving said bias control signal and said gate signal and producing a plurality of clock signals;
an output driver receiving said plurality of clock signals and said buffered serial output and producing a plurality of parallel output signals wherein said serial input is transformed to digital logic levels in said input buffer, said clock generator generates four clock signals at 90° intervals, said bias generator controls the frequency of said clock generator and said output driver produces a number of parallel output signals where said number is the ratio of a bit rate of said serial input to a bit rate of said output signals.

21. An apparatus for deserializing a serial input comprising:
- a clocked comparator circuit for receiving said serial input;
- a plurality of receiver circuits, each connected to said clocked comparator circuit and producing outputs;
- each receiver circuit including a buffer connected to said clocked comparator circuit, a bias generator connected to said buffer and producing a gate signal and a bias control signal and a clock generator receiving said gate signal and said bias control signal to produce a plurality of clock signals;
- an output driver receiving outputs from each of said plurality of receiver circuits and producing a plurality of output signals in parallel.

22. The apparatus according to claim 21, wherein said bias generator comprises:
- a phase detector receiving said buffered output;
- a charge pump connected to an output of said phase detector;
- a voltage controlled oscillator connected to an output of said charge pump and producing an output connected to a second input of said phase detector;
- said charge pump having an output which is related to said bias control signal.

23. An apparatus for deserializing a serial input comprising:
- a clocked comparator circuit for receiving said serial input;
- a plurality of receiver circuits, each connected to said clocked comparator circuit and producing outputs;
- each receiver circuit including a buffer connected to said clocked comparator circuit, a bias generator connected to said buffer and producing a gate signal and a bias control signal and a clock generator receiving said gate signal and said bias control signal to produce a plurality of clock signals;
- an output driver receiving outputs from each of said plurality of receiver circuits and producing a plurality of output signals in parallel wherein said clock generator includes a first and a second gated voltage controlled oscillator;
- a delay element;
- said first gated voltage controlled oscillator receiving said gate signal and said bias control signal and producing a clock output;
- said delay element receiving said gate signal and said bias control signal to produce a delayed gate signal where the amount of delay is controlled by said bias control signal;
- said second voltage controlled oscillator receiving said delayed gate signal and said bias control signal to produce a second clock output;
- a first and a second clock driver connected to said first and second clock outputs, respectively, for producing four clock signals at 90° intervals.

24. An apparatus for deserializing a serial input, comprising:
- an edge detector for receiving said serial input and producing a plurality of edge signals;
- a plurality of gated voltage controlled oscillators each receiving at least one of said plurality of edge signals;
- a bias generator producing a bias signal which is connected to each of said plurality of gated voltage controlled oscillators; and
- an output driver for receiving outputs from said plurality of gated voltage controlled oscillators and producing a plurality of output signals in parallel.

25. An apparatus for deserializing a serial input, comprising:
- an edge detector for receiving said serial input and producing a plurality of edge signals;
- a plurality of gated voltage controlled oscillators each receiving at least one of said plurality of edge signals;
- a bias generator producing a bias signal which is connected to each of said plurality of gated voltage controlled oscillators; and
- an output driver for receiving outputs from said plurality of gated voltage controlled oscillators and producing a plurality of output signals in parallel wherein the edge detector comprises at least one differential amplifier for receiving said serial input, at least one latch producing at least two outputs, with one output related to the rising of the serial input and the other output related to the falling of the serial input.

26. The apparatus according to claim 24, wherein the bias generator includes a delay circuit for receiving a reference clock signal and producing a delayed reference clock signal;
- a phase detector for receiving said reference clock signal and said delayed reference clock signal and producing an output; and
- a charge pump receiving said output from said phase detector and producing said bias control signal.

* * * * *